(12) United States Patent
Zhang et al.

(10) Patent No.: US 10,128,840 B2
(45) Date of Patent: Nov. 13, 2018

(54) CAPACITIVE TOUCH SENSOR

(71) Applicant: Micro Motion, Inc., Boulder, CO (US)

(72) Inventors: Mei Zhang, Nanjing (CN); Heng Zhao, Nanjing (CN); Yingxue Xu, Nanjing (CN); Kai Shen, Nanjing (CN); Chengjun Liu, Nanjing (CN); Meng Ge, Nanjing (CN)

(73) Assignee: Micro Motion, Inc., Boulder, CO (US)

( * ) Notice: Subject to any disclaimer, the term of this patent is extended or adjusted under 35 U.S.C. 154(b) by 43 days.

(21) Appl. No.: 15/123,766

(22) PCT Filed: Apr. 3, 2014

(86) PCT No.: PCT/CN2014/074715
§ 371 (c)(1),
(2) Date: Sep. 6, 2016

(87) PCT Pub. No.: WO2015/149324
PCT Pub. Date: Oct. 8, 2015

(65) Prior Publication Data
US 2017/0179952 A1    Jun. 22, 2017

(51) Int. Cl.
*H03K 17/975* (2006.01)
*H03K 17/96* (2006.01)

(52) U.S. Cl.
CPC ......... *H03K 17/975* (2013.01); *H03K 17/962* (2013.01); *H03K 2217/96076* (2013.01)

(58) Field of Classification Search
CPC .............................. H03K 17/975; H03K 17/96
See application file for complete search history.

(56) References Cited

U.S. PATENT DOCUMENTS

| 4,293,745 A | 10/1981 | Matsuda et al. |
| 4,420,811 A | 12/1983 | Tarnay et al. |
| 7,515,140 B2 * | 4/2009 | Philipp ................ H03K 17/962 178/18.06 |
| 2011/0042196 A1 | 2/2011 | Yokoyama |

FOREIGN PATENT DOCUMENTS

| CN | 201639562 U | 11/2010 |
| CN | 202385078 U | 8/2012 |
| CN | 202524371 U | 11/2012 |
| CN | 202818265 U | 3/2013 |
| CN | 103399677 A | 11/2013 |
| DE | 102009004625 A1 | 7/2009 |
| EP | 2355117 A1 | 8/2011 |
| FR | 2704332 A1 | 10/1994 |
| JP | 1997092108 A | 4/1997 |
| JP | 2006097924 A1 | 4/2006 |
| JP | 2011044362 A1 | 3/2011 |
| WO | 2008035838 A1 | 3/2008 |

* cited by examiner

*Primary Examiner* — Eric Thomas
(74) *Attorney, Agent, or Firm* — The Ollila Law Group LLC

(57) ABSTRACT

A capacitive touch sensor (100) is provided. The capacitive touch sensor (100) includes an electrode (110) disposed between a plate (120) and a spring (130) wherein the spring (130) presses the electrode (110) towards the plate (120) in a direction that is substantially parallel to a longitudinal length (L) of the spring (130) and the electrode (110) has a flat sensing surface (112) parallel with the plate (120).

23 Claims, 7 Drawing Sheets

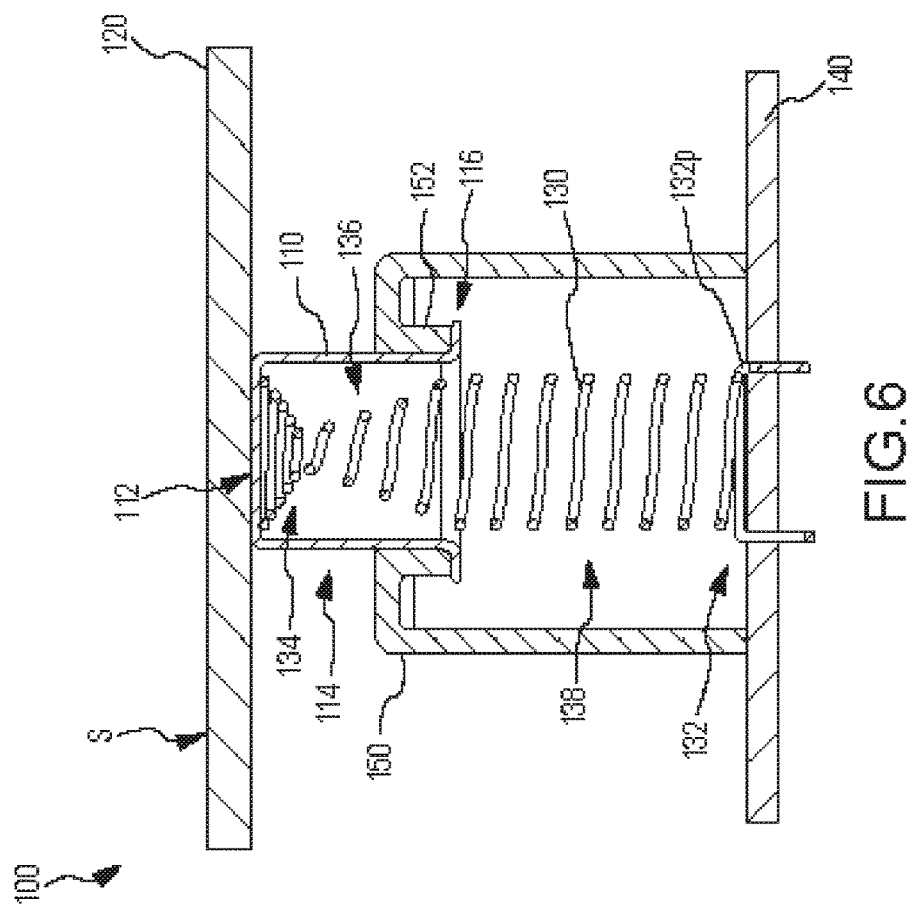

CAPACITIVE TOUCH SENSOR

TECHNICAL FIELD

The embodiments described below relate to touch sensors and, more particularly, to capacitive touch sensors.

BACKGROUND

Instruments are used in industrial applications to control processes. For example, flow meters are used to measure the mass flow rate, density, and other characteristics of materials flowing through a pipeline. The flowing materials can comprise liquids, gases, combined liquids and gases, solids suspended in liquids, liquids including gases and suspended solids, etc. The flow meter can be used to measure a flow rate (i.e., by measuring a mass flow through the flow meter), and can further be used to determine the relative proportions of components in a flow stream. The flow meter can provide data of the measurements through, for example, an interface that is accessible by an operator. Using the data provided by the flow meter, other instruments such as valves and pumps can control the materials flowing through the pipeline.

The flow meter can be employed in a wide range of industrial applications. As a result, the flow meter is often required to meet a wide range of environmental specifications. For example, the flow meter may be required to reliably function in high humidity while being subjected to temperature cycles or corrosive environments. The flow meter might also be required to accept data input in these environments. That is, an operator working on the pipeline may be required to input data into the flow meter under various environmental conditions. To input the data, the operator typically presses buttons on an interface. Due to the environmental conditions, the buttons in prior art interfaces can be prone to performance issues. For example, mechanical buttons can be subjected to corrosion in high humidity environments. Infrared buttons might need calibration routines to operate reliably in both high and low temperature. As a result, the data input through prior art buttons can include errors.

Although the interface could be configured for specific environments, such special configurations are cost prohibitive and can be the source of additional defects. Accordingly, there is a need for touch sensors that reliably operate in a wide range of environmental conditions.

SUMMARY

A capacitive touch sensor (100) is provided. According to an embodiment, the capacitive touch sensor (100) comprises an electrode (110) disposed between a plate (120) and a spring (130) wherein the spring (130) presses the electrode (110) towards the plate (120) in a direction that is substantially parallel to a longitudinal length of the spring (130) and the electrode (110) has a flat sensing surface (112) parallel with the plate (120).

A method of forming a capacitive touch sensor (100) is provided. According to an embodiment, the method comprises forming a plate (120), forming a spring (130) having a longitudinal length (L), and forming and disposing an electrode (110) between the plate (120) and the spring (130) wherein the spring (130) presses the electrode (110) towards the plate (120) in a direction that is substantially parallel to the longitudinal length (L) of the spring (130) and the electrode (110) has a flat sensing surface (112) parallel with the plate (120).

An interface (10) having a capacitive touch sensor (100) is provided. According to an embodiment, the interface (10) comprises an operation module (12), a display cover (14), a transmitter (16) wherein the display cover (14) is coupled to the transmitter (16) and the operation module (12) is disposed between the display cover (14) and the transmitter (16). The interface (10) further comprises the capacitive touch sensor (100) comprising an electrode (110) pressed against a plate (120) coupled to the display cover (14).

ASPECTS

According to an aspect, a capacitive touch sensor (100), comprises an electrode (110) disposed between a plate (120) and a spring (130) wherein the spring (130) presses the electrode (110) towards the plate (120) in a direction that is substantially parallel to a longitudinal length (L) of the spring (130) and the electrode (110) has a flat sensing surface (112) parallel with the plate (120).

Preferably, the capacitive touch sensor (100), wherein the electrode (110) further comprises an extending portion (114) that extends away from the sensing surface (112).

Preferably, the capacitive touch sensor (100), wherein the extending portion (114) interfaces with a panel (150) that prevents a movement of the electrode (110) relative to the plate (120).

Preferably, the capacitive touch sensor (100), wherein the extending portion (114) interfaces with the spring (130) to prevent a movement of the electrode (110) relative to the spring (130).

Preferably, the capacitive touch sensor (100), wherein the spring (130) comprises a first distal portion (134) that presses the electrode (110) towards the plate (120) and a second distal portion (132) that is coupled to a circuit board (140).

Preferably, the capacitive touch sensor (100), wherein the first distal portion (134) is comprised of an inverse cone region that presses against the electrode (110).

Preferably, the capacitive touch sensor (100), wherein the spring (130) comprises a conductor that electrically couples the electrode (110) with the circuit board (140).

Preferably, the capacitive touch sensor (100), wherein the spring (130) holds the electrode (110) spaced apart from the circuit board (140).

Preferably, the capacitive touch sensor (100), wherein the spring (130) is a coil spring with the longitudinal length (L).

According to an aspect, a method of forming a capacitive touch sensor (100) comprises forming a plate (120), forming a spring (130) having a longitudinal length (L), and forming and disposing an electrode (110) between the plate (120) and the spring (130) wherein the spring (130) presses the electrode (110) towards the plate (120) in a direction that is substantially parallel to the longitudinal length (L) of the spring (130) and the electrode (110) has a flat sensing surface (112) parallel with the plate (120).

Preferably, the electrode (110) further comprises an extending portion (114) that extends away from the sensing surface (112).

Preferably, the extending portion (114) interfaces with a panel (150) that prevents a movement of the electrode (110) relative to the plate (120).

Preferably, the extending portion (114) interfaces with the spring (130) to prevent movement of the electrode (110) relative to the spring (130).

Preferably, the spring (130) comprises a first distal portion (134) that presses the electrode (110) towards the plate (120) and a second distal portion (132) that is coupled to a circuit board (140).

Preferably, the first distal portion (134) is comprised of an inverse cone region that presses against the electrode (110).

Preferably, the spring (130) comprises a conductor that electrically couples the electrode (110) with the circuit board (140).

Preferably, the spring (130) holds the electrode (110) spaced apart from the circuit board (140).

Preferably, the spring (130) is a coil spring with the longitudinal length (L).

According to an aspect, an interface (10) having a capacitive touch sensor (100) comprises an operation module (12), a display cover (14), a transmitter (16) wherein the display cover (14) is coupled to the transmitter (16) and the operation module (12) is disposed between the display cover (14) and the transmitter (16), and the capacitive touch sensor (100) comprising an electrode (110) pressed against a plate (120) coupled to the display cover (14).

Preferably, the interface (10) further comprises a spring (130) wherein the electrode (110) is pressed against the plate (120) by the spring (130).

Preferably, the interface (10) wherein the spring (130) extends from a circuit board (140) disposed between the operation module (12) and the transmitter (16).

Preferably, the interface (10) wherein the electrode (110) is pressed against the plate (120) by the spring (130) in a direction that is substantially parallel to a longitudinal length (L) of the spring (130).

Preferably, the interface (10) wherein the electrode (110) is coupled to a panel (150) that is coupled to the operation module (12).

BRIEF DESCRIPTION OF THE DRAWINGS

The same reference number represents the same element on all drawings. It should be understood that the drawings are not necessarily to scale.

FIG. 6 shows a cross sectional side view of the capacitive touch sensor 100 taken at 6-6 in FIG. 4.

DETAILED DESCRIPTION

FIGS. 1-7 and the following description depict specific examples to teach those skilled in the art how to make and use the best mode of embodiments of a capacitive touch sensor. For the purpose of teaching inventive principles, some conventional aspects have been simplified or omitted. Those skilled in the art will appreciate variations from these examples that fall within the scope of the present description. Those skilled in the art will appreciate that the features described below can be combined in various ways to form multiple variations of the capacitive touch sensor. As a result, the embodiments described below are not limited to the specific examples described below, but only by the claims and their equivalents.

Figure 1:
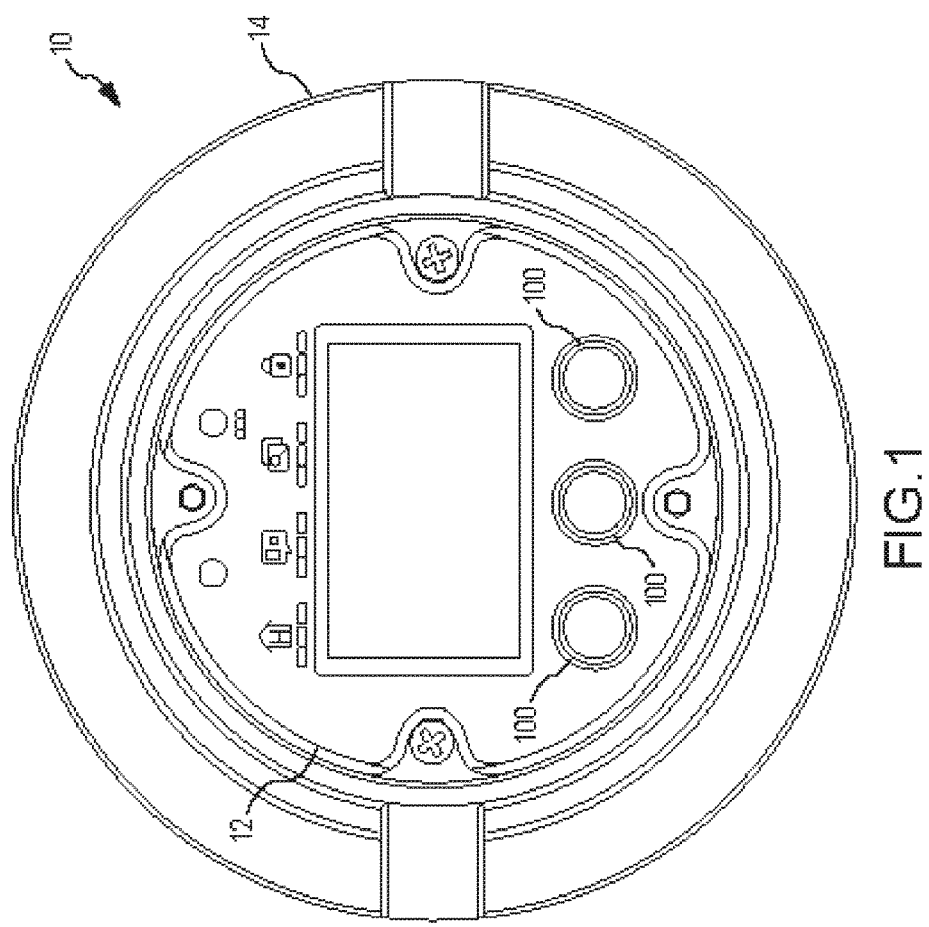
FIG. 1 shows a front plan view of an interface 10 with capacitive touch sensors 100 according to an embodiment.

FIG. 1 shows a front plan view of an interface 10 with capacitive touch sensors 100 according to an embodiment. As shown, the interface 10 includes an operation module 12 that is behind by a display cover 14. Also shown are the capacitive touch sensors 100. The interface 10 is used with instruments such as flow meters to monitor processes. The interface 10 can be mounted to a wall or a pipe stand and coupled to a flow meter (not shown) to monitor material properties such as flow rates, density, or the like. The interface 10 can also be mounted integrally with the flow meter. The interface 10 can also be used in a wide range of environmental conditions that include hazardous and uncontrolled environments such as offshore applications. In addition to receiving data from the flow meter, the interface 10 can receive data input from an operator. To input data into the interface 10, the operator presses the capacitive touch sensor 100 which senses a finger or other object, such as a stylus, through a plate.

Figure 2:
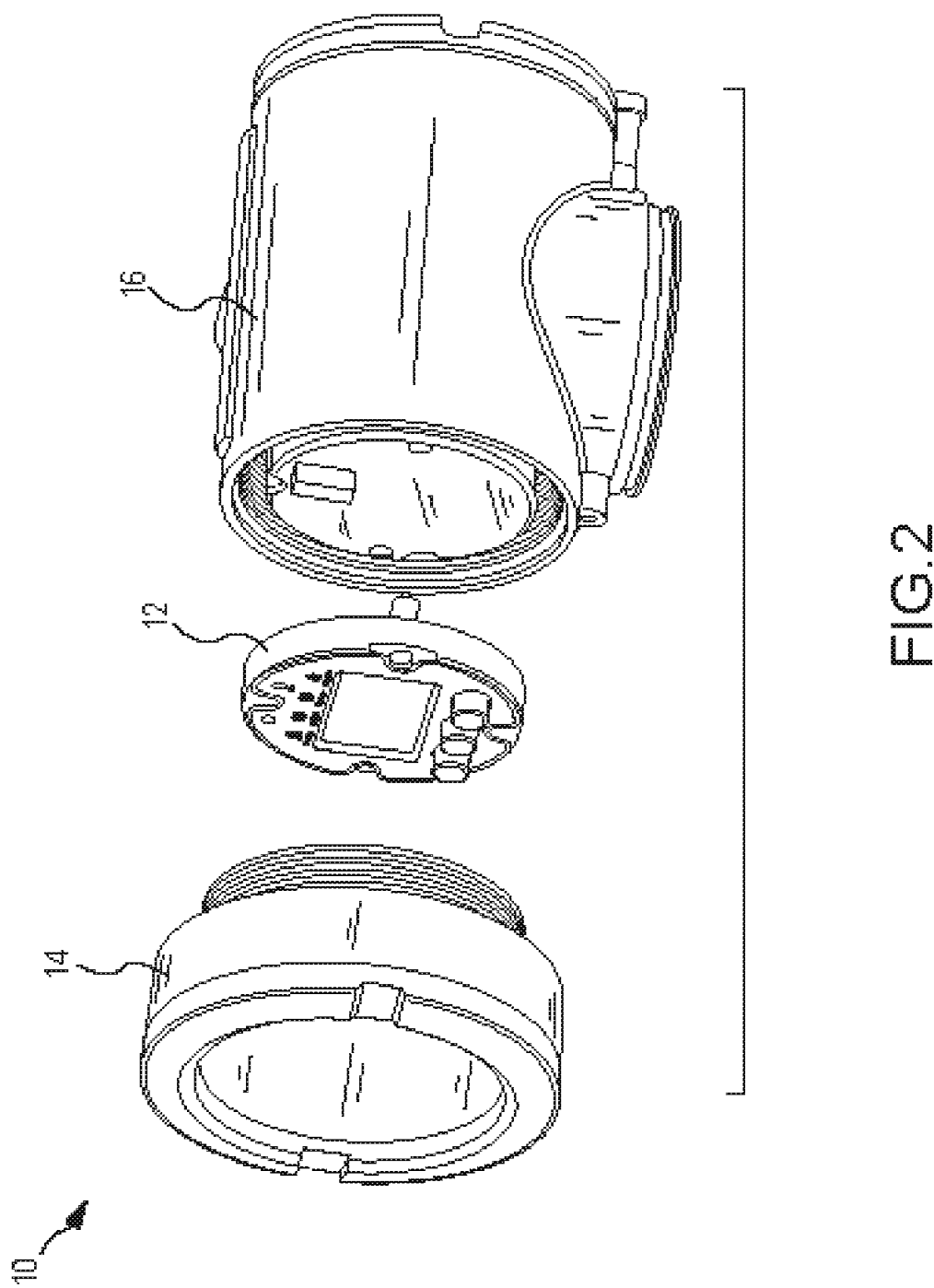
FIG. 2 shows an exploded perspective view of the interface 10 with the capacitive touch sensors 100.

FIG. 2 shows an exploded perspective view of the interface 10 with the capacitive touch sensors 100. As can be seen, the interface 10 includes the operation module 12, the display cover 14, and the transmitter 16. The operation module 12 is disposed between the display cover 14 and the transmitter 16. The operation module 12 can process signal input from the operator. The transmitter 16 can also obtain data from the flow meter as well as the operation module 12. The display cover 14 is coupled to the transmitter 16 with a threaded housing although any suitable coupling may be employed. The coupling of the display cover 14 and the transmitter 16 protects the operation module 12 from a wide range of environmental conditions. As will be described in the following, the capacitive touch sensor 100 is also able to reliably sense the operator touching on the front of the interface 10.

Figure 3:
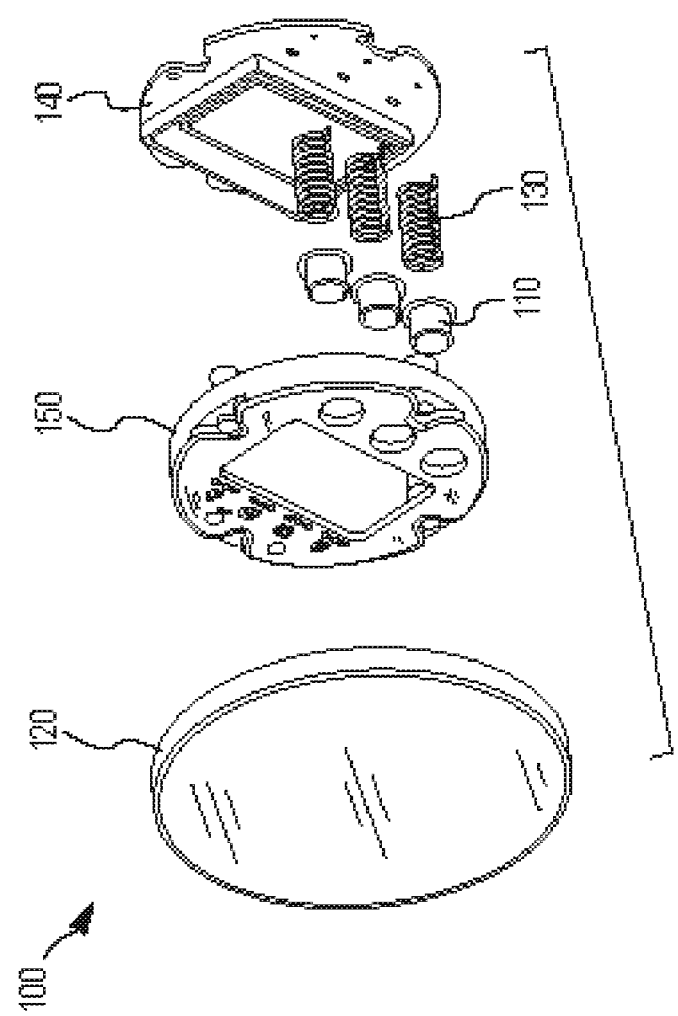
FIG. 3 shows a further exploded perspective view of the interface 10 with the capacitive touch sensors 100.

FIG. 3 shows a further exploded perspective view of the interface 10 with the capacitive touch sensors 100. The display cover 14 and the transmitter 16 are not shown for clarity. The capacitive touch sensors 100 include electrodes 110 disposed between a plate 120 and springs 130. Although not shown, the plate 120 is coupled to the display cover 14 described in the foregoing with reference to FIG. 2. Three electrodes 110 and springs 130 are shown although more or fewer may be employed in alternative embodiments. The capacitive touch sensor 100 also includes a circuit board 140 that processes signals, such as electrical signals, from the electrode 110. The circuit board 140 is coupled to a panel 150. In the embodiment shown, the signals are coupled to the circuit board 140 via the springs 130 although alternative embodiments may employ a separate signal path such as a flex circuit. The operator inputs data by touching the front of the plate 120 where the capacitive touch sensors 100 are located.

Figure 4:
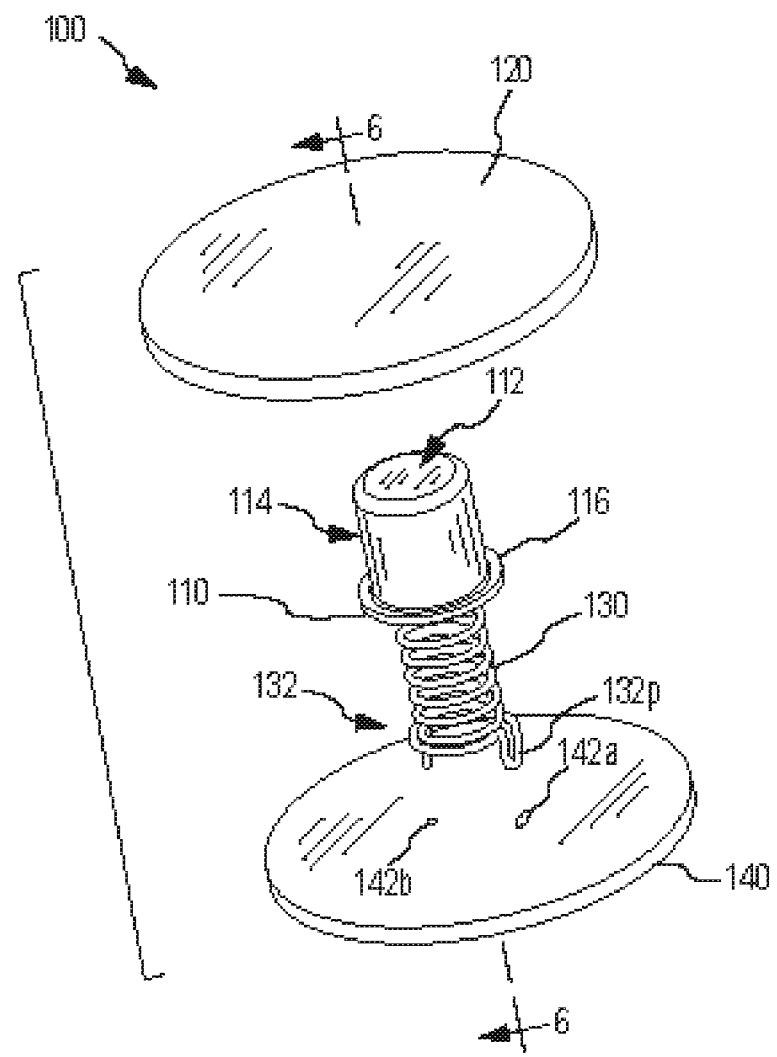
FIG. 4 shows an exploded perspective view of a simplified model of the capacitive touch sensor 100 for clarity.

FIG. 4 shows an exploded perspective view of a simplified model of the capacitive touch sensor 100 for clarity. The simplified model shows a single capacitive touch sensor 100 with disks representing portions of the plate 120 and the circuit board 140. The panel 150 is not shown so the electrode 110 and the spring 130 can be viewed without obstruction. However, in alternative embodiments, the panel 150 may not be employed. As shown in FIG. 4, the capacitive touch sensor 100 includes the electrode 110 that is disposed between the plate 120 and the spring 130. In the embodiment shown, the spring 130 can hold the electrode 110 spaced apart from the circuit board 140.

The electrode 110 includes a sensing surface 112. As shown, the sensing surface 112 is flat and parallel with the plate 120. The sensing surface 112 is also shown with a circular shape although any suitable shape may be employed in alternative embodiments. The electrode 110 also includes an extending portion 114 that extends from away from the sensing surface 112 in a perpendicular direction. The extending portion 114 has a cylindrical shape although any suitable shape can be employed. A shoulder 116 is at a distal end of the extending portion 114. Although shown as displaced away from the plate 120 in the exploded view, the sensing surface 112 can be proximate to or touching the plate 120.

In the embodiment shown, the plate 120 is a dielectric material such as glass. The material can be selected for electrical as well as mechanical properties. For example, the plate 120 can be comprised of a glass that has a desired dielectric constant. The dielectric constant can be selected to be, for example, relatively high to ensure that the capacitive touch sensor 100 operates reliably when the operator touches against the plate 120. The glass can also have mechanical properties (e.g., strength, toughness, etc.) that are suitable for use in hazardous and uncontrolled environments that could, for example, cause material to strike the plate 120. The electrode 110 is pressed towards the plate 120 by the spring 130.

The spring 130 is shown as a coil spring that is disposed between the electrode 110 and the circuit board 140. However, in alternative embodiments, the spring 130 can have different shapes and configurations. For example, an alternative spring could be conductive foam with a cylinder shape. The spring 130 also includes a distal portion 132. The distal portion 132 can mechanically and electrically couple the spring 130 to the circuit board 140. However, in alternative embodiments, the distal portion 132 can mechanically couple the spring 130 to something other than the circuit board 140. Additionally or alternatively, a conductor, such as a flex circuit, can electrically couple the electrode 110 with the circuit board 140. The distal portion 132 is shown as including posts 132p that interface with the circuit board 140.

The circuit board 140 shown with a pair of openings 142a,b although more or fewer openings can be employed. The circuit board 140 can include components, such as memory chips and processors, traces, or the like. As shown, the openings 142a,b are configured to accept the posts 132p. In alternative embodiments, soldering tabs rather than the openings 142a,b can be employed. The posts 132p can extend into the openings 142a,b. Solder can be applied to the posts 132p and the circuit board 140 to mechanically and electrically couple the spring 130 with the circuit board 140. The electrode 110 and the spring 130 are described in more detail in the following with reference to FIGS. 5a and 5b.

Figure 5B:
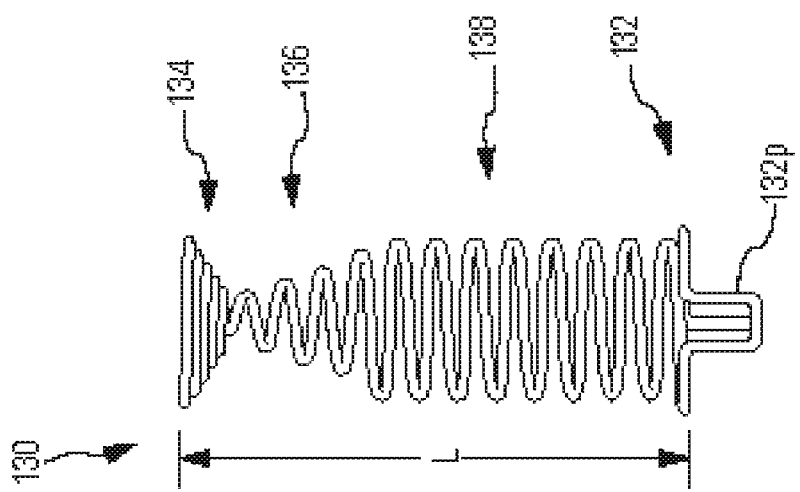
FIGS. 5a and 5b show an enlarged perspective view of the electrode 110 and an enlarged side view of the spring 130, respectively.
Figure 5A:
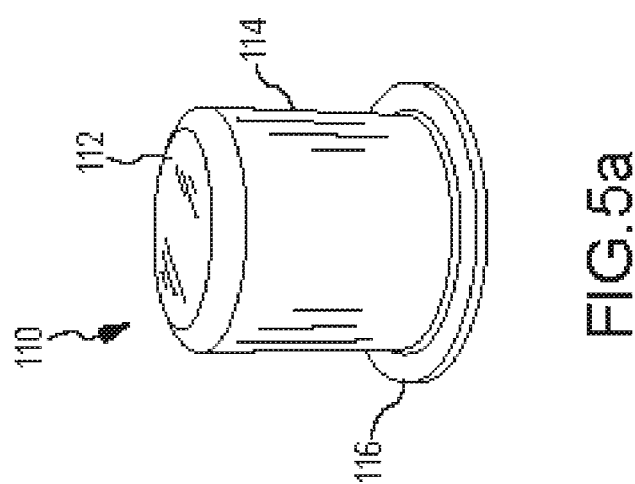

FIGS. 5a and 5b show an enlarged perspective view of the electrode 110 and an enlarged side view of the spring 130, respectively. As can be seen in FIG. 5a, the extending portion 114 extends perpendicularly away from the sensing surface 112. In alternative embodiments, the extending portion 114 can extend away from the sensing surface 112 in non-perpendicular directions and have different shapes. For example, the extending portion could extend away from the sensing surface 112 as a post that is configured to fit within, rather than surrounding, the spring 130. The spring 130 is shown as having distal portions 132, 134. Between the distal portions 132, 134 are a partial cone portion 136 and a cylindrical portion 138. The spring 130 also has a longitudinal length L. As can be seen, the distal portion 134 has an inverse cone region with a higher turn-per-length ratio than the partial cone portion 136 and the cylindrical portion 138. However, any appropriate turn ratios can be employed. The shape and dimensions of the electrode 110 and the spring 130 can be selected so the electrode 110 does not move relative to the plate 120, as will be described in more detail in the following.

FIG. 6 shows a cross sectional side view of the capacitive touch sensor 100 taken at 6-6 in FIG. 4. A simplified version of the panel 150 is shown. The extending portion 114 surrounds a portion of the spring 130. The spring 130 is coupled to the circuit board 140 via the posts 132p. Although not shown, solder can be applied to the posts 132p and the circuit board 140 to affix the spring 130 to the circuit board 140. The solder can also electrically couple the spring 130 to the circuit board 140. In the embodiment shown, the interior diameter of the extending portion 114 can be sized and dimensioned to interface with the spring 130. For example, the internal diameter of the extending portion 114 can be approximately the same as the largest diameter of the distal portion 134. The electrode 110 is coupled (e.g., slidably) to the panel 150. Additionally or alternatively, the electrode 110 can be fitted into the panel 150. Also shown is a shoulder 116 on the extending portion 114 that can press against a portion of the panel 150.

The panel 150 is shown as a rectangular cross section of a cylindrical shape having an opening. The electrode 110 can be disposed in the opening. The panel 150 is also shown with an end portion 152 that is sized about the same as the shoulder 116. Alternative shapes and cross sections can be employed. For example, an L-shaped bracket that is attached to the panel can be employed in alternative embodiments. Additionally, the panel 150 is shown as coupled to the circuit board 140. However, the electrode 110 can interface with alternative brackets that are coupled to, for example, the display cover 14. These and other interfaces can prevent movements and variations in relative positions in the capacitive touch sensor 100.

Movements in a direction parallel to the longitudinal length L of the spring 130 can be prevented. For example, the spring 130 can press the electrode 110 against the plate 120. Accordingly, a friction force can be formed that is parallel to the sensing surface 112. The friction force can prevent a movement that is perpendicular to the longitudinal length L of the spring 130. The interface between the distal portion 134 and the internal diameter of the extending portion 114 can also prevent the movement of the electrode 110 perpendicular to the longitudinal length L. For example, the distal portion 134 can be fitted into the extending portion 114. This interface can prevent the electrode 110 from moving relative to the spring 130. Additionally or alternatively, the panel 150 can prevent the movement of the electrode 110 in the direction perpendicular to the longitudinal length L of the spring 130. The extending portion 114 interfacing with the panel 150 can prevent the electrode 110 from moving relative to the panel 150.

Movement parallel to the longitudinal length L can also be prevented. For example, the electrode 110 can be pressed against the plate 120 where the sensing surface 112 is parallel to the plate 120. The force can be sufficient to prevent the electrode 110 from displacing away from the plate 120 when, for example, the interface 10 is being vibrated. The shoulder 116 is shown as interfacing the panel 150 and the electrode 110 as pressed against the plate 120. However, in alternative embodiments, the shoulder 116 may not interface the panel 150. For example, a gap can be formed between the panel 150 and the shoulder 116 when the electrode 110 presses against the plate 120. Alternatively, the shoulder 116 can prevent a movement of the electrode 110 in a direction that is parallel to the longitudinal length L of the spring 130. Accordingly, a gap may be formed between the electrode 110 and the sensing surface 112.

Variations in the relative positions in the capacitive touch sensor 100 can be reduced. For example, during assembly of the interface 10, the electrode 110 can be inserted into the panel 150 and the spring 130 inserted into the electrode 110. The circuit board 140 can be coupled to the spring 130 and the panel 150. As can be appreciated, the extending portion 114 and the shoulder 116 can interface with the panel 150 to align the electrode 110. Accordingly, the electrode 110 does not move in a direction perpendicular to the longitudinal length L of the spring 130. This ensures that the relative position of the each electrode 110 with respect to each other and the panel 150 does not change on an assembly to assembly basis (e.g., the positions are repeatable). Variations in other relative positions in the capacitive touch sensor 100 can also be reduced. For example, the distal portion 134 can interface with the internal diameter of the extending portion 114. This can prevent variations in the relative positions of the sensing surface 112 and the spring 130.

Preventing movements and reducing variation in the relative positions in the capacitive touch sensor 100 can reduce variations in the electrical properties of the capacitive touch sensor 100. For example, preventing the movement of the sensing surface 112 relative to the plate 120 prevents movement of the sensing surface 112 relative to the operator O's finger (shown in FIG. 7). The relative positions of the sensing surface 112 and the operator O's finger is therefore the same when the operator O places the finger in the same location. As a result, the change in the capacitance of the electrode 110 is the same each time the operator O presses the capacitive touch sensor 100 at the same location. Similarly, the relative positions of the electrode 110 with other electrodes, as well as the panel 150, do not vary. Reducing variation in the electrical properties in the capacitive touch sensor 100 can also improve the reliability of the capacitive touch sensor 100, as will be discussed in more detail in the following.

Figure 7:
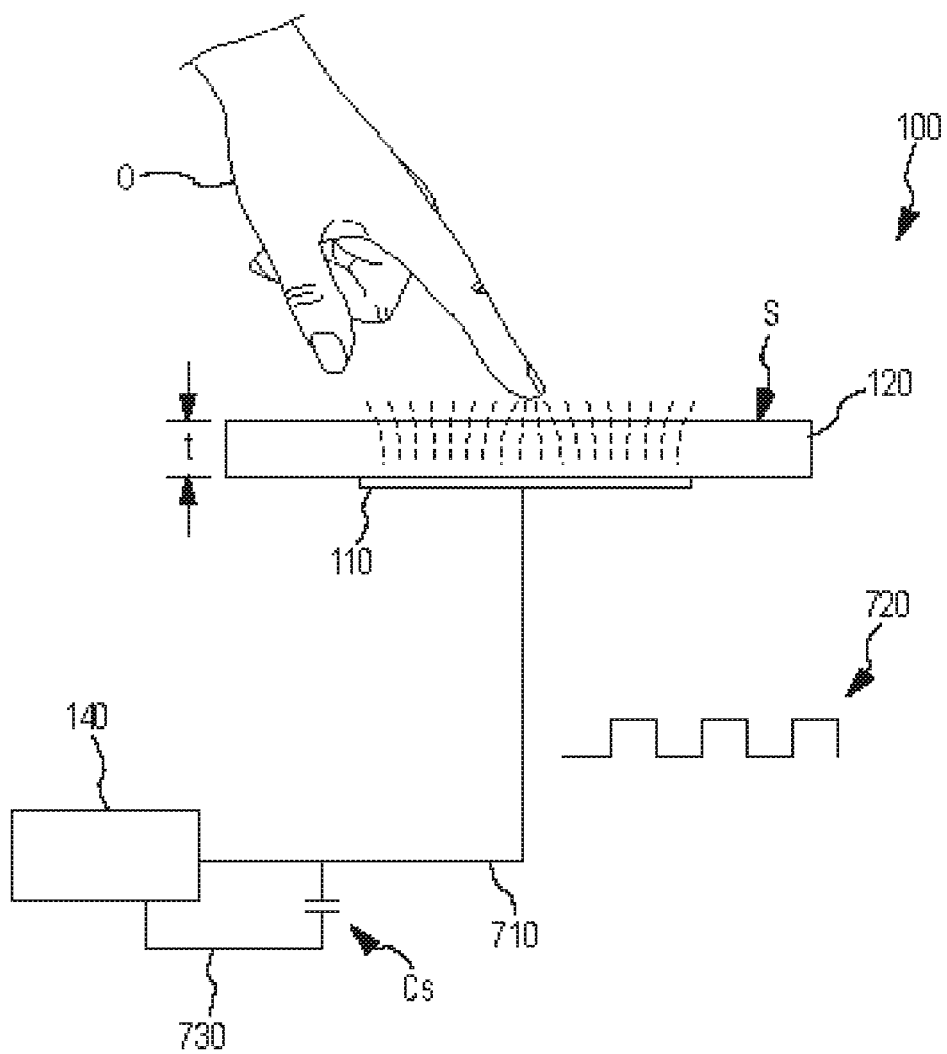
FIG. 7 shows an electrical block diagram of the capacitive touch sensor 100 according to an embodiment.

FIG. 7 shows an electrical block diagram of the capacitive touch sensor 100 according to an embodiment. The capacitive touch sensor 100 is shown with a signal path 710 coupled to the electrode 110 and the circuit board 140. Also shown is a pulse signal 720 that is generated by the circuit board 140. The pulse signal 720 is sent to the electrode 110 via the signal path 710. Also shown are a sample capacitor Cs and a sampling path 730. The capacitive touch sensor 100 is shown with field lines that radiate from electric charges in the electrode 110. The field lines radiate through the plate 120.

When an operator O moves a finger (or some other object) on the front surface of the plate 120, the field lines bend into the finger thereby coupling the electrode to the environment. This causes the capacitance of the electrode 110 to change (e.g., increase) so the pulse signal 720 will change. This change in capacitance is sensed by the circuit board 140 through the sample capacitor Cs and the sampling path 730. The change in capacitance of the electrode 110 can be small and vary due to factors such as thickness and dielectric constant of the plate 120, width and surface smoothness of the electrode 110, the capacitance of the capacitor Cs, the length of the signal path 710, and the touched area width of the operator O's finger on the plate 120.

The signal path 710 can have a physical length that is proportional to the longitudinal length L of the spring 130 and the spaced relationship between the electrode 110 and the circuit board 140. The spaced relationship can improve the ability of the capacitive touch sensor 100 to withstand the hazardous and uncontrolled environments. For example, in the embodiment described with reference to FIGS. 1-6, the circuit board 140 is disposed behind both the plate 120 and the panel 150. This can protect the circuit board 140 from the environment. However, a long signal path can distort the shape of the pulse signal 720 thereby affecting the sensing of the operator O's finger.

Preventing variation and movement in the electrode 110 ensures that the capacitance change is substantially the same each time the operator O's finger touches the plate 120. For example, by preventing the movement of the electrode 110 away from the plate 120 during use, the distance from the sensing surface 112 to the surface S of the plate 120 remains the same. Accordingly, when the interface 10 is vibrating due to, for example, vibrations in a mounting fixture, the distance between the operator O's finger and the sensing surface 112 remains the same. Similarly, the spring 130 presses the electrode 110 into the plate 120 with sufficient force to prevent the electrode 110 from moving in a direction perpendicular to the longitudinal length L of the spring 130. Additionally or alternatively, the extending portion 114 can interface with the spring 130 and the panel 150 to prevent the electrode 110 from moving perpendicular to the longitudinal length L. The electric properties of the electrode 110, therefore, do not vary as a result of the electrode 110 moving relative to the plate 120.

Dimensions as well as electrical and mechanical properties can also be selected to ensure that the capacitive touch sensor 100 reliably detects the operator O's finger. For example, a uniform and flat distribution of the charges in the electrode 110 can improve the reliability of the capacitive touch sensor 100. The charges may be uniformly distributed in the electrode 110 by using a conductor with sufficient conductivity. The charges can have the flat distribution due to the flat sensing surface 112. The flat distribution ensures that the field lines are substantially uniform within the diameter of the sensing surface 112. If the field lines varied within the width of the sensing surface 112, small changes in the position of the operator O's finger within the diameter of the sensing surface 112 can result in different capacitance of the electrode 110.

The width of the sensing surface 112 can also be selected to improve the reliability of the capacitive touch sensor 100. For example, a relatively wide sensing surface 112 ensures that the operator O can place the finger in various locations within the width of the sensing surface 112 without producing different capacitance values. For example, near the edge of the sensing surface 112, the field lines are typically bent outwards as shown. At a distance from the edge of the sensing surface 112, the field lines are vertically oriented and uniform. Due to the width of the sensing surface 112, the field lines bend with a substantially same shape as the operator O's finger moves from the center towards the edge of the sensing surface. When the operator O's finger bends the field lines that are not uniform and vertically oriented, the capacitance value of the sensing electrode 110 is not the same as when the operator O's finger is in the center of the sensing surface 112. The wide sensing surface 112 allows the capacitance change of the electrode 110 to be the same even if the operator O presses against the surface S of the plate 120 in different locations.

The thickness t of the plate 120 can also be selected to provide desired electrical and mechanical properties. For example, the field lines from the charges in the sensing surface 112 can be substantially uniform for a plate 120 with a selected thickness that is relatively thin. The selected thickness can also have sufficient mechanical strength to withstand hazardous and uncontrolled environments. The selected thickness can therefore allow the capacitive touch sensor 100 to reliably sense the operator O's finger in a wide range of environmental conditions. The thickness t can be selected along with the material's dielectric strength to ensure that the field is sufficiently strong at the surface S.

In operation, the interface 10 can be installed and coupled to a flow meter installed on a pipeline. The interface 10 can be installed in various locations such as directly coupled to the flow meter, coupled to the pipeline, affixed to a wall, or the like. The flow meter can measure and provide data on the properties of materials in the pipeline. The data can be received by the interface 10. An operator O can touch the interface 10 to obtain data or control parameters in the flow meter. The operator O's touch can be reliably sensed by the capacitive touch sensor 100 in various environmental conditions.

The capacitive touch sensor 100 can detect the operator O's finger by sensing the capacitance of the electrode 110 change. More specifically, the operator O's finger bends the field lines from the charges in the electrodes 110 to change the capacitance of the electrode 110. The change in capacitance can be detected by the circuit board 140. For example, in an embodiment, pulse signal 720 can be sent through the signal path 710. The change in capacitance of the electrode 110 and the pulse signal 720 can cause a return signal to be sent through the sampling capacitor Cs and the sampling path 730. The circuit board 140 can detect the return signal to sense the operator O's finger.

The embodiments described above provide a capacitive touch sensor 100. As explained above, the capacitive touch sensor 100 can reliably operate in a wide range of environmental conditions. For example, the field lines can be substantially uniform along the surface S of the plate 120. The capacitance change due to the operator O's finger is therefore the same within the width of the sensing surface 112. In addition, although the interface 10 may be subjected to vibration, the position of the electrode 110 relative to the surface S of the plate 120 remains the same. The relative position is the same due to, for example, the spring 130 pressing the electrode 110 against the plate 120. The relative position can also be the same due to the extending portion 114 interfacing with the spring 130 and/or the panel 150. The sensing surface 112 can also have width that is sufficiently large that the capacitance change remains the same even if the operator O's finger can touch the surface S of the plate 120 at different locations. The plate 120 is also thick enough to withstand impacts and other adverse conditions from the environment.

The detailed descriptions of the above embodiments are not exhaustive descriptions of all embodiments contemplated by the inventors to be within the scope of the present description. Indeed, persons skilled in the art will recognize that certain elements of the above-described embodiments may variously be combined or eliminated to create further embodiments, and such further embodiments fall within the scope and teachings of the present description. It will also be apparent to those of ordinary skill in the art that the above-described embodiments may be combined in whole or in part to create additional embodiments within the scope and teachings of the present description.

Thus, although specific embodiments are described herein for illustrative purposes, various equivalent modifications are possible within the scope of the present description, as those skilled in the relevant art will recognize. The teachings provided herein can be applied to other touch sensors, and not just to the embodiments described above and shown in the accompanying figures. Accordingly, the scope of the embodiments described above should be determined from the following claims.

We claim:

1. A capacitive touch sensor (100), comprising:
an electrode (110) disposed between a plate (120) and a spring (130) wherein the spring (130) presses the electrode (110) against the plate (120) in a direction that is substantially parallel to a longitudinal length (L) of the spring (130) and the electrode (110) has a flat sensing surface (112) parallel with the plate (120), wherein:
the electrode (110) interfaces with a panel (150) that prevents a movement of the electrode (110) relative to the plate (120).

2. The capacitive touch sensor (100) of claim 1, wherein the electrode (110) further comprises an extending portion (114) that extends away from the sensing surface (112).

3. The capacitive touch sensor (100) of claim 2, wherein the extending portion (114) interfaces with the panel (150) that prevents the movement of the electrode (110) relative to the plate (120).

4. The capacitive touch sensor (100) of claim 2, wherein the extending portion (114) interfaces with the spring (130) to prevent a movement of the electrode (110) relative to the spring (130).

5. The capacitive touch sensor (100) of claim 1, wherein the spring (130) comprises a first distal portion (134) that presses the electrode (110) towards the plate (120) and a second distal portion (132) that is coupled to a circuit board (140).

6. The capacitive touch sensor (100) of claim 5, wherein the first distal portion (134) is comprised of an inverse cone region that presses against the electrode (110).

7. The capacitive touch sensor (100) of claim 5, wherein the spring (130) comprises a conductor that electrically couples the electrode (110) with the circuit board (140).

8. The capacitive touch sensor (100) of claim 5, wherein the spring (130) holds the electrode (110) spaced apart from the circuit board (140).

9. The capacitive touch sensor (100) of claim 1, wherein the spring (130) is a coil spring with the longitudinal length (L).

10. A method of forming a capacitive touch sensor (100), comprising:
forming a plate (120);
forming a spring (130) having a longitudinal length (L); and
forming and disposing an electrode (110) between the plate (120) and the spring (130) wherein the spring (130) presses the electrode (110) towards the plate (120) in a direction that is substantially parallel to a longitudinal length (L) of the spring (130) and the electrode (110) has a flat sensing surface (112) parallel with the plate (120), wherein:
the electrode (110) interfaces with a panel (150) that prevents a movement of the electrode (110) relative to the plate (120).

11. The method of claim 10, wherein the electrode (110) further comprises an extending portion (114) that extends away from the sensing surface (112).

12. The method of claim 11, wherein the extending portion (114) interfaces with the panel (150) that prevents the movement of the electrode (110) relative to the plate (120).

13. The method of claim 11, wherein the extending portion (114) interfaces with the spring (130) to prevent a movement of the electrode (110) relative to the spring (130).

14. The method of claim 10, wherein the spring (130) comprises a first distal portion (134) that presses the electrode (110) towards the plate (120) and a second distal portion (132) that is coupled to a circuit board (140).

15. The method of claim 14, wherein the first distal portion (134) is comprised of an inverse cone region that presses against the electrode (110).

16. The method of claim 14, wherein the spring (130) comprises a conductor that electrically couples the electrode (110) with the circuit board (140).

17. The method of claim 14, wherein the spring (130) holds the electrode (110) spaced apart from the circuit board (140).

18. The method of claim 10, wherein the spring (130) is a coil spring with the longitudinal length (L).

19. An interface (10) having a capacitive touch sensor (100), comprising:
   an operation module (12) including an electrode (110) and a panel (150);
   a display cover (14) including a plate (120);
   a transmitter (16), wherein:
   the display cover (14) is coupled to the transmitter (16) and the operation module (12) is disposed between the display cover (14) and the transmitter (16); and
   the electrode (110) is pressed against the plate (120) coupled to the display cover (14) and interfaced with the panel (150) that prevents a movement of the electrode (110) relative to the plate (120).

20. The interface (10) of claim 19 further comprising a spring (130) wherein the electrode (110) is pressed against the plate (120) by the spring (130).

21. The interface (10) of claim 20 wherein the spring (130) extends from a circuit board (140) disposed between the operation module (12) and the transmitter (16).

22. The interface (10) of claim 20 wherein the electrode (110) is pressed against the plate (120) by the spring (130) in a direction that is substantially parallel to a longitudinal length (L) of the spring (130).

23. The interface (10) of claim 19 wherein the electrode (110) is coupled to a panel (150) that is coupled to the operation module (12).

* * * * *